US 10,837,985 B2

(12) United States Patent
Wolf et al.

(10) Patent No.: US 10,837,985 B2
(45) Date of Patent: Nov. 17, 2020

(54) APPARATUS FOR MEASURING AN ELECTRIC CURRENT THROUGH A BUS BAR

(71) Applicant: TE Connectivity Germany GmbH, Bensheim (DE)

(72) Inventors: Marco Wolf, Hochstadt (DE); Christian Berger, Speyer (DE)

(73) Assignee: TE CONNECTIVITY GERMANY GMBH, Bensheim (DE)

(*) Notice: Subject to any disclaimer, the term of this patent is extended or adjusted under 35 U.S.C. 154(b) by 366 days.

(21) Appl. No.: 15/878,885

(22) Filed: Jan. 24, 2018

(65) Prior Publication Data
US 2018/0149678 A1    May 31, 2018

Related U.S. Application Data

(63) Continuation of application No. PCT/EP2016/067586, filed on Jul. 22, 2016.

(30) Foreign Application Priority Data

Jul. 24, 2015   (DE) ........................ 10 2015 009 603

(51) Int. Cl.
G01R 15/18    (2006.01)
G01R 33/025   (2006.01)
(Continued)

(52) U.S. Cl.
CPC ......... G01R 15/185 (2013.01); G01R 15/148 (2013.01); G01R 33/025 (2013.01); G01R 33/04 (2013.01)

(58) Field of Classification Search
None
See application file for complete search history.

(56) References Cited

U.S. PATENT DOCUMENTS 4,492,919 A * 1/1985 Milkovic ............. G01R 15/146
                                              323/357
5,465,012 A   11/1995 Dunnam
(Continued)

FOREIGN PATENT DOCUMENTS

JP    08136587 A    5/1996
WO    2013176271 A1   11/2013

OTHER PUBLICATIONS

Notification, International Search Report and Written Opinion, dated Nov. 3, 2016, 14 pages.
(Continued)

Primary Examiner — Jas A Sanghera

(57) ABSTRACT

An apparatus for measuring an electric current through a bus bar comprises a compensation coil and a magnetic field sensor. The bus bar has a through-hole dividing the electric current flowing through the bus bar into at least two partial currents flowing around the through-hole. The compensation coil is disposed in the through-hole and generates a compensation field. The compensation field compensates a plurality of magnetic fields generated by the partial currents and/or an external magnetic field such that a magnetic flux density of a resulting magnetic field at a predetermined position of the through-hole does not exceed a predetermined threshold. The magnetic field sensor is disposed in the through-hole and detects the magnetic flux density of the resulting magnetic field at the predetermined position. The magnetic field sensor emits an output signal corresponding to the detected magnetic field.

20 Claims, 5 Drawing Sheets

(51) Int. Cl.
*G01R 33/04* (2006.01)
*G01R 15/14* (2006.01)

(56) References Cited

U.S. PATENT DOCUMENTS

| | | |
|---|---|---|
| 6,636,029 B1 | 10/2003 | Kunze et al. |
| 2013/0099765 A1 | 4/2013 | Girard et al. |
| 2014/0218018 A1 | 8/2014 | Ivanov et al. |

OTHER PUBLICATIONS

Ripka P., "Advances in fluxgate sensors", Sensors and Actuators A: Physical, Elsevier BV, NL, vol. 106, No. 1-3, Sep. 15, 2003, pp. 8-14, XP004446510, 7 pages.
Vizmuller P: "The Flux-Gate Magnetometer: A Very Sensitive Elf Magnetic Detector", RF Design, Primedia Business Magazines & Media, Overland Park, KS, US, vol. 17, No. 1, Jan. 1, 1994, 4 pages.
Abstract of JPH08136587, dated May 31, 1996, 1 page.

* cited by examiner

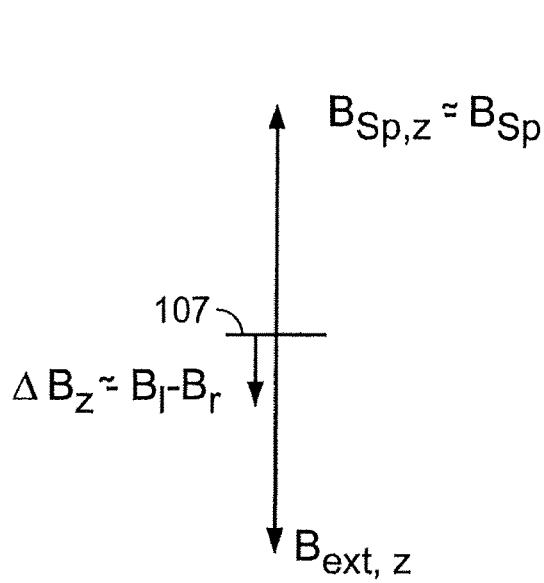
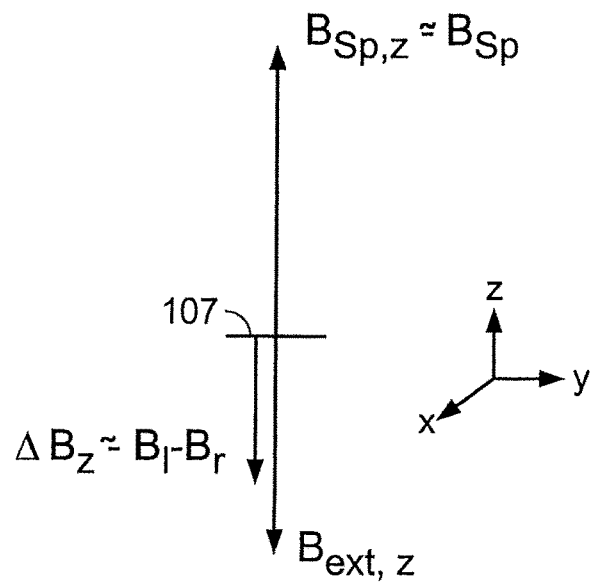
Fig. 5a      Fig. 5b
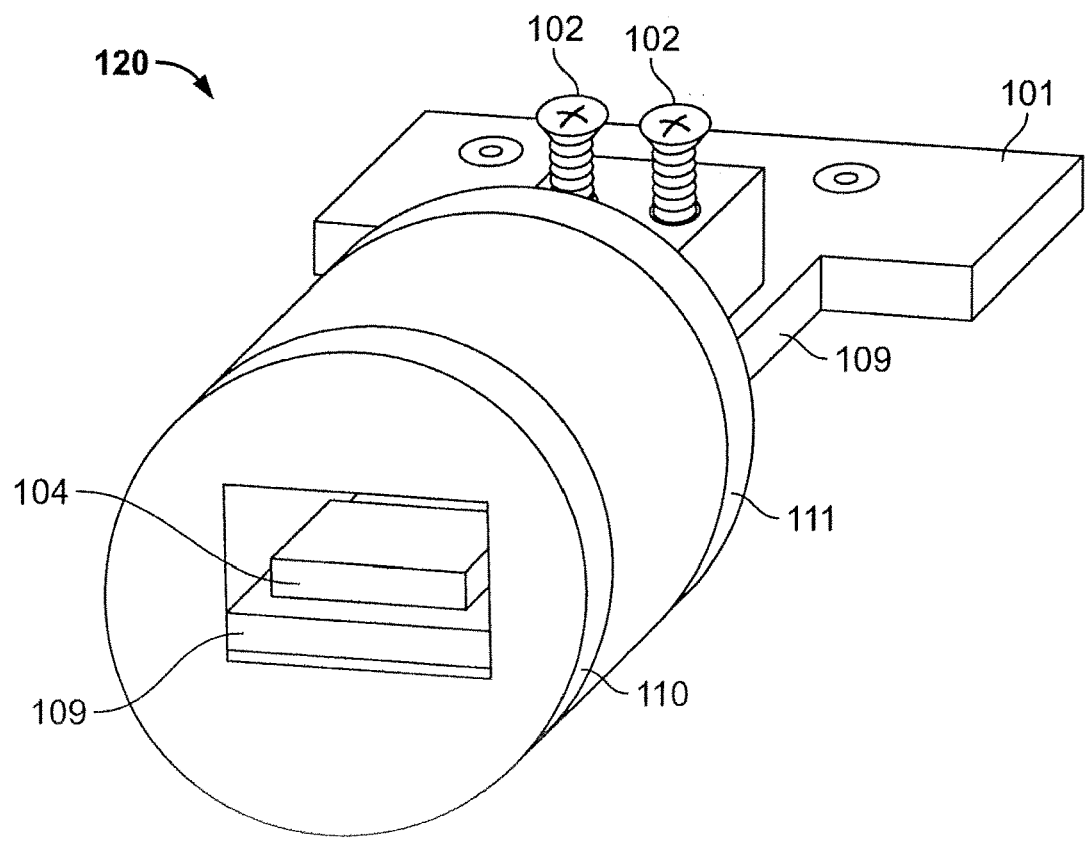
Fig. 6

APPARATUS FOR MEASURING AN ELECTRIC CURRENT THROUGH A BUS BAR

CROSS-REFERENCE TO RELATED APPLICATIONS

This application is a continuation of PCT International Application No. PCT/EP2016/067586, filed on Jul. 22, 2016, which claims priority under 35 U.S.C. § 119 to German Patent Application No. 102015009603.6, filed on Jul. 24, 2015.

FIELD OF THE INVENTION

The present invention relates to an apparatus for measuring an electric current and, more particularly, to an apparatus for measuring an electric current through a bus bar.

BACKGROUND

A known apparatus for measuring an electric current I that flows through a bus bar 5, disclosed in Japanese Patent No. H08136587, is shown in FIG. 1. The bus bar 5 has a rectangular cross-section transverse to the propagation direction of the electric current I and has a continuous box-shaped slot 6 which is situated symmetrically relative to the axis of the bus bar 5. The electric current I flowing through the bus bar 5 is divided by the slot 6 into two substantially identical partial currents having the strength of current I/2. These partial currents which flow respectively above and below the slot 6 join together into an electric current of the strength I after they have passed the slot 6.

Each of the two partial currents generates, in the interior of the slot 6, a magnetic field of which the magnetic flux density is substantially perpendicular to the aperture of the slot 6. The upper partial current generates a magnetic flux density directed upwards in the interior of the slot 6 and the lower partial current generates a magnetic flux density directed downwards in the interior of the slot 6. The resulting magnetic flux density in the interior of the slot 6 substantially corresponds to the difference in the magnetic flux densities generated by the upper and lower partial currents.

The resulting magnetic flux density in the interior of the slot 6, which is proportional to the electric current I flowing through the bus bar 5, is detected by a fluxgate magnetometer 4 arranged in the interior of the slot 6. An electric signal which corresponds to the detected magnetic flux density is output by the fluxgate magnetometer 4. Another similar known apparatus for measuring an electric current in a bus bar is disclosed in U.S. Pat. No. 6,636,029.

The apparatus shown in FIG. 1 can be impaired by an external magnetic field which overlies the magnetic fields generated by the two partial currents. External magnetic fields, in particular those generated during the operation of electrically powered vehicles, are mostly time-constant magnetic fields, the magnetic flux density of which substantially exceeds the resulting magnetic flux density generated by the two partial currents in the interior of the slot 6. External magnetic fields can thus saturate the fluxgate magnetometer 4 and disrupt the unambiguous correlation/proportionality between the electric signal output by the fluxgate magnetometer 4 and the strength of current of the electric current I flowing through the bus bar 5. External magnetic fields which are time-constant are also referred to hereafter as magnetic common mode fields.

In order to reduce the effect of external magnetic common mode fields on the measuring result of the fluxgate magnetometer 4, a differential fluxgate sensor can be used to detect the magnetic flux density. A differential fluxgate sensor has two fluxgate magnetometers oriented in parallel which are integrated in an integrated circuit ("IC") and is capable of compensating an undesired external magnetic common mode field to a certain extent. For example, differential fluxgate sensors are capable of compensating external magnetic common mode fields of up to 2 mT.

However, for applications in the automobile field, in particular in the case of electrically powered vehicles, the compensation of external magnetic common mode fields with a magnetic flux density of up to 3 mT is required. The effect of such magnetic common mode fields on the measurement result of the apparatus shown in FIG. 1 can alternatively be kept low through magnetic screening of the apparatus. However, such a solution would be very complex and expensive.

SUMMARY

An apparatus for measuring an electric current through a bus bar comprises a compensation coil and a magnetic field sensor. The bus bar has a through-hole dividing the electric current flowing through the bus bar into at least two partial currents flowing around the through-hole. The compensation coil is disposed in the through-hole and generates a compensation field. The compensation field compensates a plurality of magnetic fields generated by the partial currents and/or an external magnetic field such that a magnetic flux density of a resulting magnetic field at a predetermined position of the through-hole does not exceed a predetermined threshold. The magnetic field sensor is disposed in the through-hole and detects the magnetic flux density of the resulting magnetic field at the predetermined position. The magnetic field sensor emits an output signal corresponding to the detected magnetic field.

BRIEF DESCRIPTION OF THE DRAWINGS

The invention will now be described by way of example with reference to the accompanying Figures, of which:

FIG. 5A is a schematic view of a plurality of magnetic flux densities generated at a predetermined position in the bus bar;

FIG. 5B is a schematic view of another plurality of magnetic flux densities generated at the predetermined position in the bus bar;

FIG. 6 is a perspective view of an arrangement for detecting a magnetic field according to another embodiment of the invention.

DETAILED DESCRIPTION OF THE EMBODIMENT(S)

Figure 1:
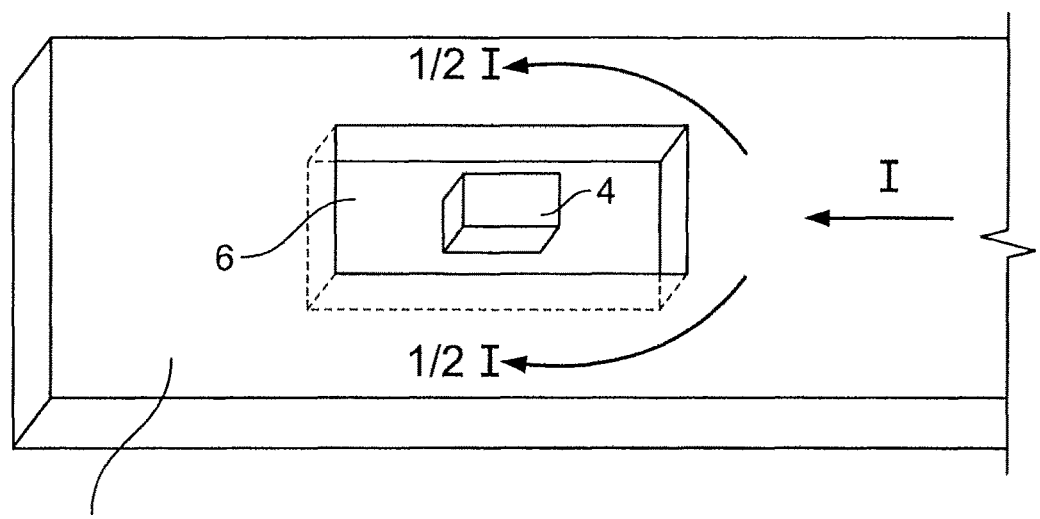
FIG. 1 is a perspective view of a known apparatus for measuring an electric current through a bus bar.

Exemplary embodiments of the present invention will be described hereinafter in detail with reference to the attached drawings, wherein like reference numerals refer to like elements. The present invention may, however, be embodied in many different forms and should not be construed as being limited to the embodiments set forth herein. Rather, these embodiments are provided so that the present disclosure will be thorough and complete and will fully convey the concept of the disclosure to those skilled in the art.

Figure 2A:
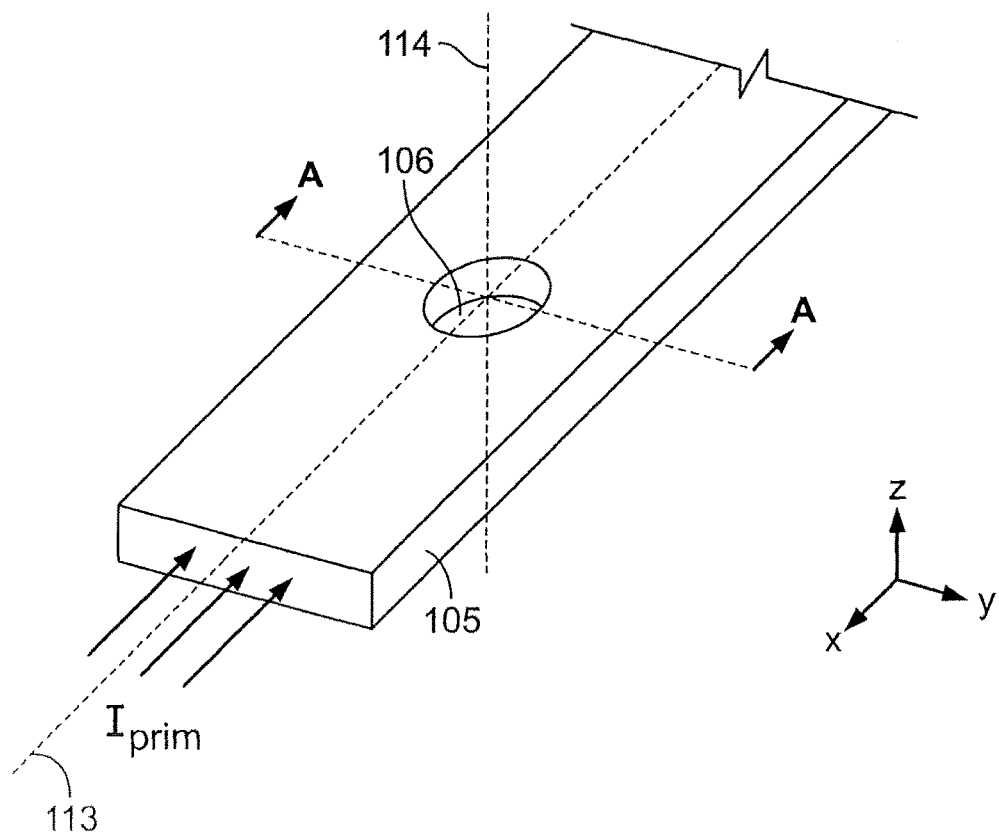
FIG. 2A is a perspective view of a bus bar and an electric current which flows through the bus bar.
Figure 2B:
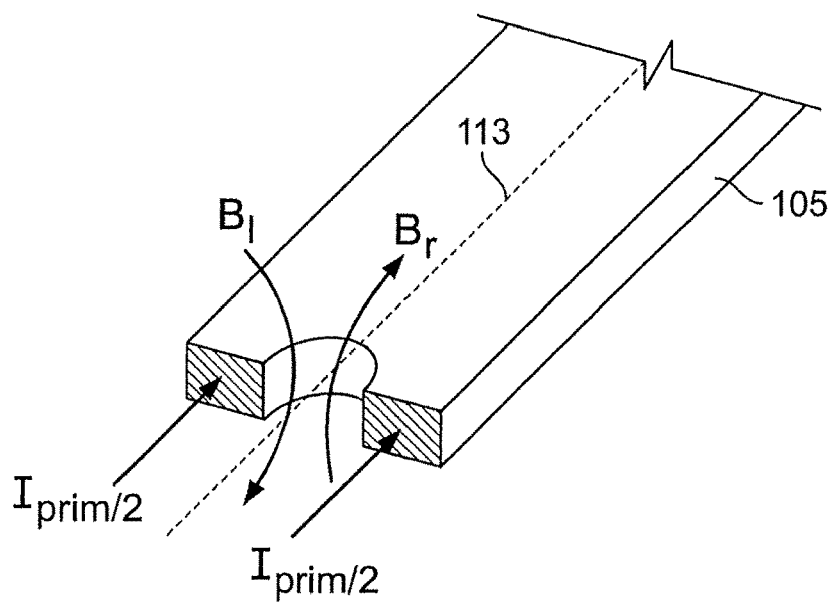
FIG. 2B is a sectional view of the bus bar of FIG. 2A taken along line A-A.

A bus bar 105 according to the invention is shown in FIGS. 2A and 2B. An electric current Iprim flows through the bus bar 105 and the strength of current is measured/determined with the aid of the apparatus according to the present invention. The bus bar 105 is box-shaped with a longitudinal axis 113 along which the electric current Iprim is propagated. In other embodiments, the bus bar 105 may be cylindrically shaped and/or have bends.

The bus bar 105, as shown in FIG. 2A, has a cylindrical through-hole 106 extending centrally through the upper and lower side faces of the bus bar 105. An axis of symmetry 114 of the through-hole 106 extends perpendicular to the longitudinal axis 113 and intersects it. The axis of symmetry 114 is also perpendicular to the upper and/or lower side faces of the bus bar 105. In other embodiments, the axis of symmetry 114 of the through-hole 106 has any direction relative to the longitudinal axis 113 of the bus bar 105 including directions such that the through-hole 106 has an incline compared to the upper/lower sides of the bus bar 105. In other embodiments, the axis of symmetry 114 of the through-hole 106 does not intersect the longitudinal axis 113 of the bus bar 105 such that the through-hole 106 is arranged offset with regard to the longitudinal axis 113. In further embodiments, the through-hole 106 has a form different from the cylindrical form, for example, a box-shaped form. In other embodiments, the hole 106 does not extend fully though the bus bar 105 but is a non-continuous recess.

The current density distribution of the electric current Iprim is substantially symmetrical with regard to the longitudinal axis 113 of the bus bar 105. At the location of the through-hole 106, the electric current Iprim is divided into two identical partial currents of the strength of current Iprim/2, shown in FIG. 2B. One of the partial currents flows through the part of bus bar 105 which is located between the through-hole 106 and the left side face of the bus bar 105 and the other partial current flows through the part of the bus bar 105 which is located between the through-hole 106 and the right side face of the bus bar 105. After the two partial currents have passed the through-hole 106, they join together again into an electric current of the strength of current Iprim. The electric partial current flowing through the left part of the bus bar 105 generates a magnetic field Bl which surrounds the left part of the bus bar 105 (approximately in a circle) and the electric partial current flowing through the right part of the bus bar 105 generates a magnetic field Br which surrounds the right part of the bus bar 105 (approximately in a circle).

The magnetic field lines corresponding to the two magnetic fields Bl and Br extend through the through-hole 106 in opposite directions, as shown in FIG. 2B, such that the resulting magnetic flux density at one point of the through-hole 106 substantially corresponds to the difference in the magnetic flux densities Bl and Br. This difference represents a measurement of the electric current Iprim flowing through the bus bar 105. At predetermined positions of the through-hole 106, for example in the middle, this difference is substantially proportional to the electric current Iprim flowing through the bus bar 105.

In the three-dimensional coordinate system shown in FIG. 2A, the longitudinal axis 113 of the bus bar 105 runs parallel to the x-axis of the coordinate system and the axis of symmetry 114 of the through-hole 106 runs parallel to the z-axis of the coordinate system. The resulting magnetic flux density of the magnetic fields Bl and Br generated by the two partial currents is also substantially parallel to the z-axis. The resulting magnetic flux density of the magnetic fields Bl and Br has a component in the z-axis which substantially exceeds the components in the x- and y-axes.

In the exemplary embodiment shown in FIG. 2B, the two partial currents are identical. However, the partial currents may be different in other embodiments. This is the case, for example, when the current density distribution of the electric current Iprim is not symmetrical with respect to the longitudinal axis 113 of the bus bar 105 or the through-hole 106 is arranged offset with respect to the longitudinal axis 113. In these cases too, the resulting magnetic flux density at a point in the interior of the through-hole 106 corresponds to the electric current Iprim flowing through the bus bar 105.

In order to be able to deduce the strength of current of the electric current Iprim flowing through the bus bar 105, the resulting magnetic flux density of the magnetic fields Bl and Br generated by the two partial currents must be measured at a predetermined position in the interior of the through-hole 106. This location is selected for as precise a proportionality as possible between the detected magnetic flux density and the strength of current of the electric current Iprim flowing through the bus bar 105.

Figure 3:
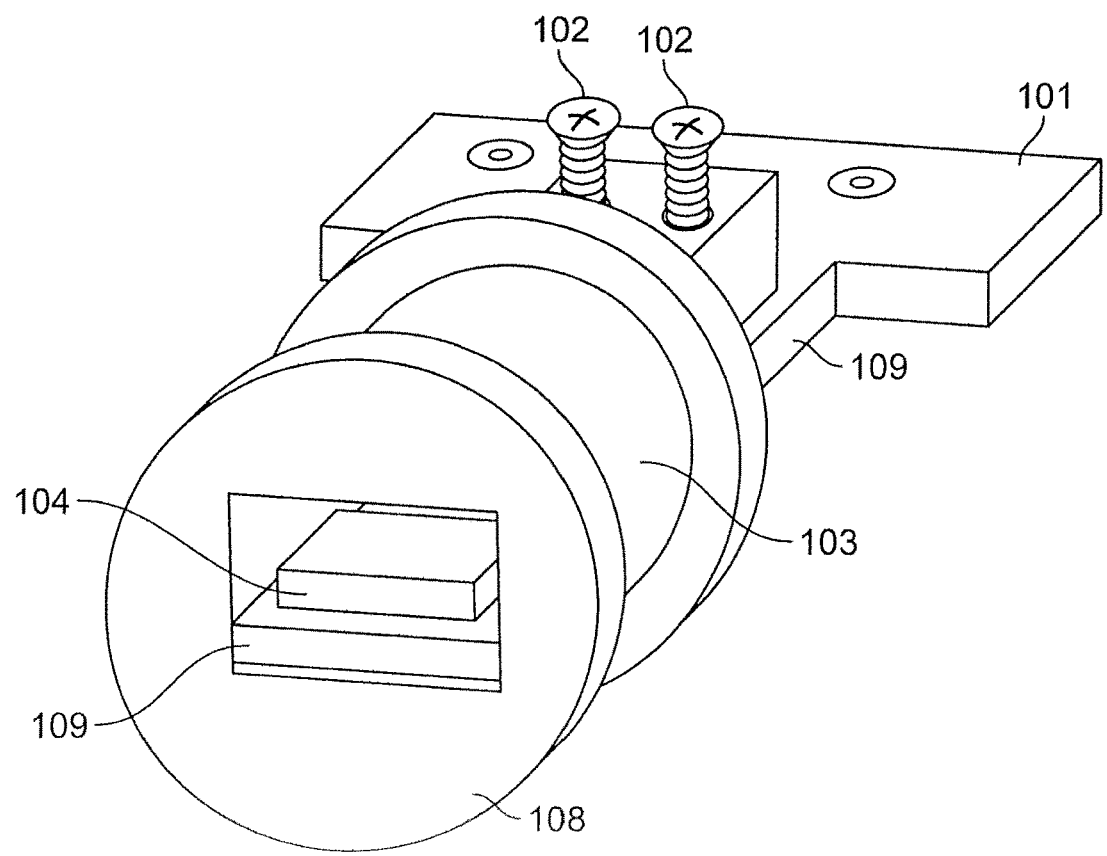
FIG. 3 is a perspective view of an arrangement for detecting a magnetic field according to an embodiment of the invention.

An arrangement for detecting, measuring, and determining the magnetic flux density at a predetermined position in the interior of the through-hole 106, used in the apparatus according to the present invention, is shown in FIG. 3.

The arrangement as shown in FIG. 3 has a circuit board 101 with a protruding part 109, a magnetic field sensor 104 arranged on the protruding part 109 of the circuit board 101, and a compensation coil 103 with a bobbin 108. Windings for generating a magnetic compensation field are provided in the compensation coil 103.

The inner part of the bobbin 108 receives the part of the protruding part 109 of the circuit board 101 on which the magnetic field sensor 104 is arranged. The protruding part 109 of the circuit board 101 and the bobbin 108 are positioned relative to one another such that the magnetic field sensor 104 attached onto the protruding part 109 is located in a region of the interior of the bobbin 108 in which the magnetic compensation field generated by the compensation coil 103 is homogeneous. The circuit board 101 has a T-shape, the base of the T-shape corresponding to the protruding part 109 of the circuit board 101, and the magnetic field sensor 104 is arranged at the lower end of the protruding part 109.

The bobbin 108 of the compensation coil 103 and the circuit board 101 are mechanically firmly connected to one another such that both together form a rigid unit and the magnetic field sensor 104 remains in a fixed/determined position relative to the windings of the compensation coil 103. The windings of the compensation coil 103 are electrically connected to the circuit board 101 by press-fit pins 102 shown in FIG. 3. When inserting the protruding part 109 into the interior of the bobbin 108, the press-fit pins 102 can be used as reference points for the mechanical positioning of the compensation coil 103 relative to the circuit board 101.

The magnetic field sensor 104 is, for example, a fluxgate magnetometer which provides at an output an electric signal which corresponds to the detected magnetic flux density. Fluxgate magnetometers are saturated and thus the proportionality between the output signal and the magnetic flux density to be detected is disrupted if the magnetic flux density to be detected exceeds a maximum value. This maximum value can be exceeded for example if, at the location of the fluxgate magnetometer, an external magnetic common mode field overlays the magnetic field which is generated by the two partial currents flowing around the through-hole 106, and which is a measure of the electric current Iprim flowing through the bus bar 105.

In order to eliminate the effect of magnetic common mode fields up to a certain strength on the measuring result of the magnetic field sensor 104, differential fluxgate magnetometers are employed as magnetic field sensors. Differential fluxgate magnetometers (hereafter referred to simply as differential fluxgate(s)) are capable of compensating external magnetic common mode fields up to a predetermined magnetic flux density, for example 2 mT. However, if the magnetic flux density of the external magnetic common mode field exceeds this predetermined value, then the output signal of the differential fluxgate is disrupted. A differential fluxgate has two fluxgate magnetometers oriented to be parallel which are integrated in an integrated circuit. The output signal of the differential fluxgate is a combination of the output signals of the two fluxgate magnetometers; the output signals of the two fluxgate magnetometers are combined such that the effect of the magnetic common mode field is eliminated. As long as the magnetic flux density of the external magnetic common mode field does not exceed the predetermined value, there is an unambiguous correlation between the output signal of the differential fluxgate and the magnetic flux density to be detected.

The arrangement shown in FIG. 3 for detecting the magnetic flux density is introduced into the through-hole 106 of the bus bar 105 shown in FIG. 2A and is fixed there such that the magnetic field sensor 104 is positioned at the predetermined position of the through-hole 106 to form the apparatus 100 for measuring the electric current Iprim through the bus bar 105. The protruding part 109 of the circuit board 101 with the compensation coil 103 fixed on it is inserted into the through-hole 106 until the magnetic field sensor 104 reaches the depth in which the predetermined position is located. The outer edge of the bobbin 108 has the same form as the through-hole 106 such that the outer edge of the bobbin 108 fits precisely together with the inner wall of the through-hole 106. In various embodiments, the bobbin 108 may also have the same height as the bus bar 105.

Figure 4:
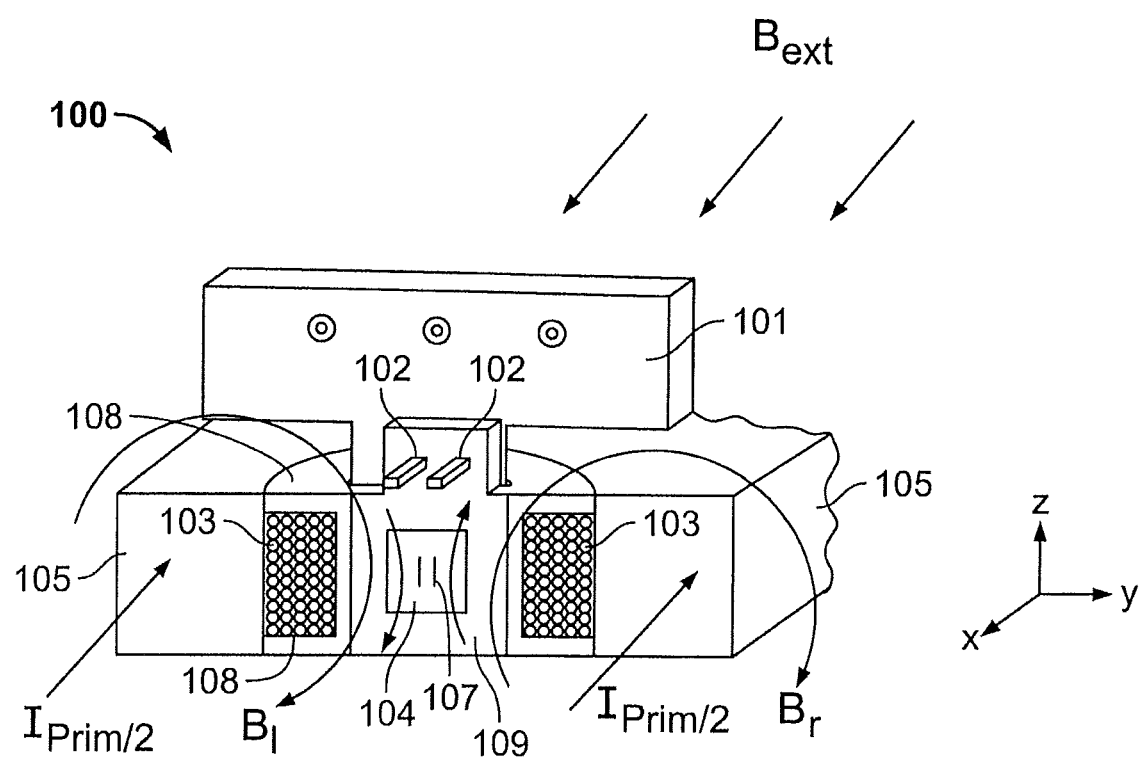
FIG. 4 is a sectional view of an apparatus for measuring an electric current through a bus bar taken along line A-A in FIG. 2A.

An apparatus 100 for measuring the electric current Iprim through the bus bar 105 is shown in FIG. 4 in cross-section. The cross-section extends through the through-hole 106, is perpendicular to the longitudinal axis 113 of the bus bar 105, and extends through the predetermined position 107 at which the magnetic field is meant to be detected by the magnetic field sensor 104. This figure also shows an external magnetic common mode field Bext which is generated from outside of the apparatus 100, and which, at the predetermined position 107, overlays the resulting magnetic field which is to be detected and which is generated by the two partial currents Iprim/2 at the predetermined position 107. In the three-dimensional coordinate system shown in FIG. 4, the bus bar 105 runs in the x-direction, the depth of the through-hole 106 and the height of the bobbin 108 run in the z-direction, and the protruding part 109 of the circuit board 101 likewise runs in the z-direction. The external magnetic common mode field Bext, which can have any direction with reference to the bus bar 105, also has a component in the z-direction.

The magnetic field sensor 104 located at the predetermined position 107 is a differential fluxgate and has the two fluxgate magnetometers oriented such that they detect the z-component of the resulting magnetic flux density. The resulting magnetic flux density relates to the magnetic fields Bl and Br generated by the two partial currents Iprim/2, to the external magnetic common mode field Bext, and to a compensation field Bsp which is generated by the compensation coil 103 and which is oriented substantially parallel to the z-axis at the predetermined position 107. The compensation field Bsp has a homogeneous region at the predetermined position 107.

In the apparatus 100, as shown in FIG. 4, the compensation coil 103 and the bobbin 108 are cylindrical and have an axis of symmetry which coincides with the axis of symmetry 114 of the through-hole 106. The bobbin 108 of the compensation coil 103 and the bus bar 105 have identical heights. In addition, the compensation coil 103 is inserted into the through-hole 106 until the upper and lower side faces of the bobbin 108 fit together with the upper and lower side faces respectively of the bus bar 105 in a planar manner. The outer edge of the bobbin 108 also fits precisely together with the inner wall of the through-hole 106. The protruding part 109 of the circuit board 101 has a longitudinal axis which is parallel to the axis of symmetry 114 of the through-hole 106 and is perpendicular to the longitudinal axis 113 of the bus bar 105. The differential fluxgate 104 is positioned on the protruding part 109 of the circuit board 101 such that it assumes the predetermined position 107 in the through-hole 106 when the compensation coil 103 is introduced.

If the external magnetic common mode field at the predetermined position 107 exceeds a certain strength, for example 2 mT, then the differential fluxgate 104 is saturated and the output signal it provides no longer corresponds to the magnetic field available at the predetermined position 107. In order to avoid this malfunction, the compensation coil 103 generates the compensation field Bsp, which, at the predetermined position 107, compensates the external magnetic common mode field Bext such that the magnetic flux density of the resulting magnetic field at the predetermined position 107 does not exceed a predetermined threshold, for example 2 mT.

The compensation coil 103 shown in FIG. 4 generates at the predetermined position 107 the compensation field Bsp which is substantially parallel to the z-axis; the z-component of the compensation field (Bsp,z) and the z-component of the external magnetic common mode field (Bext,z) have opposing directions.

FIG. 5A shows the magnetic flux densities of the magnetic fields occurring at the predetermined position 107 if the resulting magnetic field Bl-Br generated by the two partial currents Iprim/2 has a z-component ΔBz which is smaller than the predetermined value 2 mT, for example. The z-component of the external magnetic common mode field Bext,z and the z-component ΔBz overlay one another at the predetermined position 107. The overlaying of these two magnetic flux densities would lead to their result exceeding the predetermined value of 2 mT, for example. However, the compensation field Bsp,z compensates the z-component of the external magnetic common mode field Bext,z such that the sum of all magnetic fields available at the predetermined position 107 have a magnetic flux density which remains under the exemplary predetermined value of 2 mT.

The external magnetic common mode field Bext is not necessarily constant in time; it is dependent on the exterior/local conditions in which the apparatus 100 is employed. In the apparatus 100, the external magnetic common mode field to be compensated, for example its z-component Bext,z, is thus constantly detected anew, an electrical signal is generated corresponding to the newly detected external magnetic common mode field, and, on the basis of this signal, the compensation coil 103 is activated such that it generates a compensation field which compensates the detected external magnetic common mode field. This compensation mechanism represents a closed control loop in which the current is controlled by the compensation coil 103. The compensation of the external magnetic common mode field Bext takes place in a closed control circuit, wherein the strength of current of the current flowing through the compensation coil 103 is controlled such that the compensation field Bsp generated by the compensation coil 103 compensates the external magnetic common mode field Bext at the predetermined position 107. For example, the current is controlled by the compensation coil 103 such that the z-component of the compensation field, Bsp,z, compensates the z-component of the external magnetic common mode field, Bext,z. The control can be conducted by an analog or digital controller.

For the magnetic field configuration shown in FIG. 5A in the apparatus 100, which uses two differential fluxgate magnetometers as a magnetic field sensor, the following algorithm is applied to control the strength of current of the current flowing through the compensation coil 103. The following labels apply with regard to the foregoing:

Bl,mess, the magnetic field in the z-direction which is measured/detected by the left fluxgate at the predetermined position 107;

Br,mess, the magnetic field in the z-direction which is measured by the right fluxgate at the predetermined position 107;

Bi, the magnetic field in the z-direction resulting at the predetermined position 107 generated by the electric current Iprim flowing through the bus bar 105, Bi substantially corresponds to ΔBz from FIG. 5A;

Isp, the strength of current of the current to be flowing through the compensation coil 103;

Nsp, the number of windings of the compensation coil 103; and k, a constant, with the following equations applying:

$$Bsp,z = k\, Nsp\, Isp \qquad \text{(equation 1)}$$

$$Bl,\text{mess} = +Bi + Bext,z + Bsp,z \qquad \text{(equation 2)}$$

$$Br,\text{mess} = -Bi + Bext,z + Bsp,z \qquad \text{(equation 3)}$$

The useful signal supplied by the two differential fluxgate magnetometers which unambigously corresponds to the electric current Iprim flowing through the bus bar 105 emerges from the difference between equations 2 and 3 to:

$$Bl,\text{mess} - Br,\text{mess} = 2\, Bi \qquad \text{(equation 4)}$$

The resulting magnetic common mode field detected/perceived by the two differential fluxgate magnetometers emerges from the sum of equations 2 and 3 to:

$$Bl,\text{mess} + Br,\text{mess} = 2\, Bext,z + 2\, Bsp,z \qquad \text{(equation 5)}$$

Compensation of the external magnetic common mode field at the predetermined position 107 is thus achieved if Bl,mess+Br,mess=0. With the aid of equation 1 and equation 5, the following results for the strength of current Isp of the current flowing through the compensation coil 103:

$$Bext,z + kNsp\, Isp = 0. \qquad \text{(equation 6)}$$

In an apparatus 100 which has a differential fluxgate magnetometer as a magnetic field sensor, the strength of current Isp of the current flowing through the compensation coil 103 is controlled such that the sum of the magnetic fields detected by the two fluxgates of the differential fluxgate magnetometer, Bl,mess+Br,mess, does not exceed a predetermined threshold. In an embodiment, the predetermined threshold is zero.

Malfunctioning of the differential fluxgate 104 can also occur if the resulting magnetic field generated by the two partial currents has a magnetic flux density which exceeds the predetermined value of 2 mT, for example. This is the case, for example, if the through-hole 106 is not arranged in the center with reference to the longitudinal axis 113, and if the two partial currents accordingly have very different strengths of current. The apparatus 100 is capable of compensating such asymmetries by the compensation coil 103 generating a compensation field Bsp which is directed opposite the resulting magnetic field generated by the two partial currents and compensates it to such an extent that the resulting magnetic flux density at the predetermined position 107 does not exceed the predetermined threshold of 2 mT, for example. If an external magnetic common mode field Bext is also present at the predetermined position 107, the compensation field Bsp generated by the compensation coil 103 also compensates for this.

FIG. 5B shows the magnetic flux densities of the magnetic fields occurring at the predetermined position 107 if the resulting magnetic field Bl-Br generated by the two partial currents has a z-component ΔBz which is larger than the predetermined value of 2 mT, for example. At the predetermined position 107, an external magnetic common mode field Bext is also available, the z-component of which is overlaid with the z-component ΔBz. The compensation coil 103 in this case generates a compensation field Bsp,z such that the sum of all magnetic fields available at the predetermined position 107 has a magnetic flux density which is smaller than the exemplary predetermined value of 2 mT.

An arrangement for detecting the magnetic field according to a second embodiment of the invention is shown in FIG. 6. This arrangement 120 differs from the arrangement shown in FIG. 3 only in that it has a Helmholtz coil as a compensation coil. The design and function of the arrangements shown in FIGS. 3 and 6 are otherwise identical. The Helmholtz coil has two equal-size coils 110 and 111 which are wound in the same direction and which are arranged spaced apart from one another, the spacing between the coils being equal to the radius of the coils. The overlaying of the fields generated by the two coils 110 and 111 arises between the two coils, close to the coil axis a region with a largely homogeneous magnetic field. The differential fluxgate 104 is positioned in this region. Therefore, its output signal is disturbed less by the inhomogeneity of the magnetic field which is to be detected. In other embodiments, the spacing between the two coils 110 and 111 is not equal to the radius of the two coils.

Figure 7:
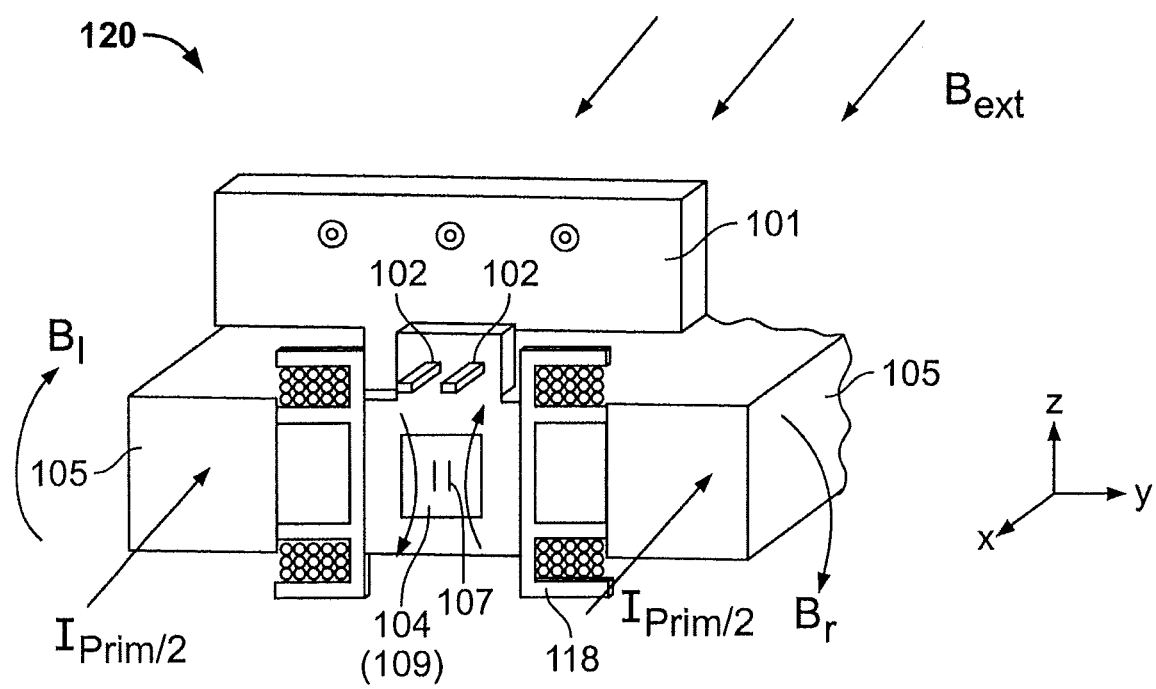
FIG. 7 is a sectional view of an apparatus for measuring an electric current through a bus bar according to another embodiment of the invention taken along line A-A in FIG. 2.

An apparatus 120 for measuring an electric current Iprim through the bus bar 105 according to the second embodiment of the invention is shown in FIG. 7 which incorporates the arrangement shown in FIG. 6. In the three-dimensional coordinate system shown in FIG. 7, the bus bar 105 runs in the x-direction, and the depth of the through-hole 106 and the height of the bobbin 118 of the Helmholtz coil run in the z-direction. The protruding part 109 of the circuit board 101 likewise runs in the z-direction.

The apparatus 100, 120 can also be used in a battery disconnect unit, for example, in particular in electrically powered vehicles between a battery and a drive unit. On the basis of the measurement result from the apparatus 100, 120, the battery disconnect unit can cut off the electric current in the bus bar 105 if it is too high. Therefore, the present invention also relates to a battery disconnect unit which has the apparatus 100, 120 for measuring the electric current through a bus bar according to the present invention.

What is claimed is:

1. An apparatus for measuring an electric current through a bus bar, comprising:
    the bus bar having a through-hole dividing the electric current flowing through the bus bar into at least two partial currents flowing around the through-hole, the through-hole extending through the bus bar in a direction perpendicular to a direction of the electric current in the bus bar;
    a compensation coil disposed in the through-hole and generating a compensation field, the compensation field compensating a plurality of magnetic fields generated by the partial currents and/or an external magnetic field such that a magnetic flux density of a resulting magnetic field at a predetermined position of the through-hole does not exceed a predetermined threshold; and
    a magnetic field sensor disposed in the through-hole and detecting the magnetic flux density of the resulting magnetic field at the predetermined position, the magnetic field sensor emitting an output signal corresponding to the detected magnetic flux density of the resulting magnetic field.

2. The apparatus of claim 1, wherein the compensation coil has a bobbin receiving the magnetic field sensor.

3. The apparatus of claim 2, further comprising a circuit board with a protruding part, the magnetic field sensor disposed on the protruding part.

4. The apparatus of claim 3, wherein the compensation coil and the circuit board are mechanically connected to one another and electrically connected to one another by a plurality of press-fit pins.

5. The apparatus of claim 4, wherein the bobbin receives the protruding part and the protruding part, the bobbin, and the through-hole are situated relative to one another such that the magnetic field sensor is at the predetermined position.

6. The apparatus of claim 1, wherein the at least two partial currents have an identical flow strength.

7. The apparatus of claim 1, wherein the magnetic field sensor detects a component of the magnetic flux density perpendicular to the direction of the electric current in the bus bar, the output signal corresponds to the component, and the compensation coil generates the compensation field so that the component does not exceed the predetermined threshold.

8. The apparatus of claim 7, wherein a strength of a current flowing in the compensation coil is controlled in a closed control circuit to generate the compensation field.

9. The apparatus of claim 1, wherein a strength of a current flowing in the compensation coil is controlled in a closed control circuit to generate the compensation field.

10. The apparatus of claim 1, wherein the magnetic field sensor has a fluxgate magnetometer and the output signal of the magnetic field sensor is an output signal of the fluxgate magnetometer.

11. The apparatus of claim 1, wherein the magnetic field sensor has a pair of fluxgate magnetometers oriented in parallel in an integrated circuit and the output signal of the magnetic field sensor is a combination of a pair of output signals of the pair of fluxgate magnetometers.

12. The apparatus of claim 11, wherein the pair of output signals of the pair of fluxgate magnetometers are combined such that there is an unambiguous correlation between the output signal of the magnetic field sensor and a strength of the electric current if the magnetic flux density of the resulting magnetic field does not exceed the predetermined threshold.

13. The apparatus of claim 12, wherein one of the pair of output signals of the pair of fluxgate magnetometers corresponds to a first magnetic flux density and the other of the pair of output signals of the pair of fluxgate magnetometers corresponds to a second magnetic flux density, the compensation field is generated such that a sum of the first magnetic flux density and the second magnetic flux density does not exceed the predetermined threshold.

14. The apparatus of claim 13, wherein the predetermined threshold is zero.

15. The apparatus of claim 1, wherein the compensation coil has a pair of coils connected behind one another, a plurality of windings of the pair of coils being wound in a same direction and the pair of coils being arranged spaced apart from one another.

16. The apparatus of claim 15, wherein each of the pair of coils is a Helmholtz coil and the predetermined position is located between the pair of coils in a region of a homogenous magnetic field.

17. The apparatus of claim 1, wherein the through-hole is cylindrical or box-shaped and has an axial symmetry.

18. The apparatus of claim 17, wherein an outer edge of the compensation coil has a same form as the through-hole and fits with an inner wall of the through-hole, the through-hole and the compensation coil having a same height.

19. The apparatus of claim 17, wherein the bus bar has a longitudinal axis and a box-shaped cross-section transverse to the longitudinal axis, the electric current in the bus bar is parallel to the longitudinal axis, and an axis of symmetry of the through-hole intersects with and is perpendicular to the longitudinal axis of the bus bar.

20. A battery disconnect unit, comprising:
    an apparatus for measuring an electric current through a bus bar, including:
    the bus bar having a through-hole dividing the electric current flowing through the bus bar into at least two partial currents flowing around the through-hole, the through-hole extending through the bus bar in a direction perpendicular to a direction of the electric current in the bus bar; a compensation coil disposed in the through-hole and generating a compensation field, the compensation field compensating a plurality of magnetic fields generated by the partial currents and/or an external magnetic field such that a magnetic flux density of a resulting magnetic field at a predetermined position of the through-hole does not exceed a predetermined threshold; and a magnetic field sensor disposed in the through-hole and detecting the magnetic flux density of the resulting magnetic field at the predetermined position, the magnetic field sensor emitting an output signal corresponding to the detected magnetic flux density of the resulting magnetic field.

\* \* \* \* \*